(12) United States Patent
Dadashev

(10) Patent No.: US 6,836,443 B2
(45) Date of Patent: Dec. 28, 2004

(54) APPARATUS AND METHOD OF HIGH SPEED CURRENT SENSING FOR LOW VOLTAGE OPERATION

(75) Inventor: Oleg Dadashev, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 51 days.

(21) Appl. No.: 10/341,933

(22) Filed: Jan. 14, 2003

(65) Prior Publication Data

US 2004/0136256 A1 Jul. 15, 2004

(51) Int. Cl.[7] .................................................. G11C 7/02
(52) U.S. Cl. ........................ 365/207; 365/206; 365/210
(58) Field of Search ...................... 365/189.01, 189.07, 365/205, 206, 207, 210

(56) References Cited

U.S. PATENT DOCUMENTS 6,256,247 B1 * 7/2001 Perner ......................... 365/209
6,469,929 B1 * 10/2002 Kushnarenko et al. . 365/185.06
6,678,187 B2 * 1/2004 Sugibayashi et al. ....... 365/158

\* cited by examiner

Primary Examiner—Van Thu Nguyen
(74) Attorney, Agent, or Firm—Bever, Hoffman & Harms, LLP; E. Eric Hoffman

(57) ABSTRACT

A sensing system for a memory cell in a memory array includes a current integrator circuit configured to integrate a read current through the memory cell and a reference current through a reference memory cell. The integration process creates a set of differential measurement voltages that can be used to determine the state of the memory cell. By integrating the read current to obtain a measurement voltage, rather than directly comparing the read current to a reference current, the sensing system can use lower supply voltages than conventional sensing systems. In addition, because the measurement voltages are generated by integrating the read current over time, sensing operations are less sensitive to supply voltage fluctuations and the accuracy. Also, for memory cells that exhibit small read currents, the accuracy of sensing operations can be increased by increasing the period of integration.

24 Claims, 8 Drawing Sheets

US 6,836,443 B2

APPARATUS AND METHOD OF HIGH SPEED CURRENT SENSING FOR LOW VOLTAGE OPERATION

FIELD OF THE INVENTION

This invention relates generally to semiconductor memories, and more particularly to a high-speed sensing system for low voltage memories.

BACKGROUND OF THE INVENTION

Various types of memory devices, such as random access memory (RAM), read-only memory (ROM) and non-volatile memory (NVM), are known in the art. A memory device includes an array of memory cells and peripheral supporting systems for managing, programming and data retrieval operations.

Each of the memory cells in a memory device can be configured to provide an electrical output signal during a read operation. A sense amplifier is coupled to receive the electrical output signal, and in response, provide a data output signal representative of the logic state of the data stored by the memory cell.

In general, sense amplifiers determine the logical value stored in a memory cell by comparing the electrical output signal (i.e., voltage or current) provided by the cell with a threshold value (i.e., voltage or current). If the electrical output signal exceeds the threshold value, the sense amplifier provides a data output signal having a first logic value (e.g., logic "1"), thereby indicating that the memory cell is in a first logic state (e.g., an erased state). Conversely, if the electrical output signal is less than the threshold value, the sense amplifier provides a data output signal having a second logic value (e.g., logic "0"), thereby indicating that the memory cell is in a second logic state (e.g., a programmed state).

The threshold value is typically set at a level that is between the expected electrical output signal for a programmed state of a memory cell and the expected electrical output signal for an erased state of a memory cell. It is desirable to set the threshold value at a level that is sufficiently far from both expected levels, so that noise on the electrical output signal will not cause false results.

FIG. 1 is a block diagram of a conventional memory device 100, which includes memory array 110, reference memory array 112, clamping circuits 120–121, sense amplifier first stages 130–131, and sense amplifier second stage 140. Memory array 110 and reference memory array 112 each include a plurality of non-volatile memory cells arranged in rows and columns. For example, memory array 100 includes non-volatile memory cell 111, and reference memory array 112 includes non-volatile memory cell 113. Clamping circuit 120 includes PMOS transistors P1–P2, NMOS transistor N1 and comparator C1, which are connected as illustrated. Similarly, clamping circuit 121 includes PMOS transistors P7–P8, NMOS transistor N2, and comparator C2, which are connected as illustrated. Clamping circuits 120 and 121 cause the charging operation to be performed in a staged manner to improve the efficiency of the sensing operation. Sense amplifier first stage 130 includes PMOS transistor P3 and NMOS transistor N4. Sense amplifier first stage 131 includes PMOS transistor P6 and NMOS transistor N3. Sense amplifier second stage 140 includes PMOS transistors P4–P5, and current comparator circuit 141.

To read (or "sense") the state of a memory cell in memory array 110, the word line and bit lines associated with the memory cell are selected. For example, to read memory cell 111, a read voltage is applied to word line W1 by a row decoder, while bit line $B_N$ is coupled to a system bit line BL by a column decoder, and bit line $B_{N+1}$ is grounded. A corresponding reference memory cell 113 in reference array 112 is configured in a similar manner. Thus, a read voltage is applied to word line W1 by a row decoder, while bit line $B_M$ is coupled to a reference bit line BL_REF by a column decoder, and bit line $B_{M+1}$ is grounded. System bit line BL and reference bit line BL_REF exhibit capacitances $C_{BL}$ and $C_{REF\_BL}$, respectively.

Sense amplifier first stage 130 and clamping circuit 120 apply a sense voltage on system bit line BL, thereby causing a read current $I_{BL}$ to flow through memory cell 111. The magnitude of the read current $I_{BL}$ is determined by the logic state of memory cell 111 (i.e., programmed or erased). This read current $I_{BL}$ is mirrored to PMOS transistor P4 of sense amplifier second stage 140.

Similarly, sense amplifier first stage 131 and clamping circuit 121 apply the sense voltage on reference bit line BL_REF, thereby causing a read current $I_{BL\_REF}$ to flow through reference memory cell 113. The magnitude of the read current $I_{BL\_REF}$ is determined by the logic state of reference memory cell 113. Reference memory cell 113 is programmed such that the magnitude of the read current $I_{BL\_REF}$ is less than the magnitude of the read current $I_{BL}$ when memory cell 111 is programmed, and greater than the magnitude of the read current $I_{BL}$ when memory cell 111 is erased. The read current $I_{BL\_REF}$ is mirrored to PMOS transistor P5 of sense amplifier second stage 140.

After the read currents $I_{BL}$ and $I_{BL\_REF}$ have had time to develop, the enable signal EN is activated, thereby causing comparator circuit 141 to detect the difference between these read currents. In response, comparator circuit 141 provides an output data signal $D_{OUT}$, representative of the data stored in memory cell 111.

Memory device 100 is described in more detail in commonly owned, co-pending U.S. patent application Ser. No. 09/935,013, "Structure and Method for High Speed Sensing of Memory Arrays", by Alexander Kushnarenko and Oleg Dadashev [TSL-103].

Memory device 100 will not operate properly unless the $V_{DD}$ supply voltage is greater than a minimum voltage $V_{DD\_MIN}$, which is defined as follows.

$$V_{DD\_MIN} = V_{DIODE\_MAX} + V_{BL\_MIN} + V_{P1/P8} + V_{P2/P7} \qquad (1)$$

In Equation (1), $V_{DIODE\_MAX}$ is the maximum voltage drop across PMOS transistor P3 or PMOS transistor P6, $V_{BL\_MIN}$ is the minimum acceptable bit line voltage for the non-volatile memory technology, $V_{P1/P8}$ is the drain-to-source voltage drop of PMOS transistor P1 (or PMOS transistor P8), and $V_{P2/P7}$ is equal to the drain-to-source voltage drop on PMOS transistor P2 (or PMOS transistor P7).

For example, if $V_{DIODE\_MAX}$ is equal to 1.0 Volt, $V_{BL\_MIN}$ is equal to 1.8 Volts, and $V_{P1/P8}$ and $V_{P2/P7}$ are equal to 0.05 Volts, then the minimum supply voltage $V_{DD\_MIN}$ is equal to 2.9 Volts (1.8V+1V+0.05V+0.05V). In such a case, memory device 100 would not be usable in applications that use a $V_{DD}$ supply voltage lower than 2.9 Volts.

In addition, sense amplifier first stages 130 and 131 are sensitive to noise in the $V_{DD}$ supply voltage. If, during a read operation, the $V_{DD}$ supply voltage rises to an increased voltage of $V_{DD\_OVERSHOOT}$, then the voltages $V_{SA1}$ and $V_{SA2}$ on the drains of PMOS transistors P3 and P6 rise to a level approximately equal to $V_{DD\_OVERSHOOT}$ minus a diode voltage drop. If the $V_{DD}$ supply voltage then falls to a reduced voltage of $V_{DD\_UNDERSHOOT}$, then transistors P3 and P6 may be turned off. At this time, sense amplifier first stages 130 and 131 cannot operate until the voltages $V_{SA1}$ and $V_{SA2}$ are discharged by the cell currents $I_{BL}$ and $I_{BL\_REF}$. If the cell current $I_{BL}$ is low, then sense amplifier first stage 130 will remain turned off until the end of the read operation, thereby causing the read operation to fail.

Accordingly, it is desirable to provide a sensing system that can accommodate low supply voltages and tolerate supply voltage fluctuations.

SUMMARY OF THE INVENTION

The present invention provides a system and method for sensing the state of a memory cell by integrating current differences between a read current produced by the memory cell and a reference current produced by a reference memory cell. The integration process generates differential measurement voltages that can be compared to determine the state of the memory cell relative to the state of the reference memory cell. By performing a sensing operation in this manner, low supply voltages can be accommodated and sensitivity to supply voltage noise can be minimized.

According to an embodiment of the invention, a sensing system for sensing the state of a memory cell includes a sense amplifier first stage for detecting the read current of the memory cell and the reference current of the reference memory cell. The sense amplifier first stage generates differential voltages by integrating over time two measurement currents—the first measurement current being a function of the reference current minus the read current, and the second measurement current being a function of the read current minus the reference current. The resulting differential voltages can then be compared to determine the state of the memory cell relative to the reference memory cell. Because the differential voltages are the result of cumulative current measurements over time, rather than a read current or voltage value at a particular moment in time, sensing operations performed using the sense amplifier first stage can be much less sensitive to supply voltage levels and/or fluctuations than sensing operations using conventional sensing systems.

According to an embodiment of the invention, the sense amplifier first stage includes a first current source and a second current source producing equal constant currents. A portion of the constant current from the first current source provides the read current for the memory cell, while a portion of the constant current from the second current source provides the reference current for the reference memory cell. Half of the remainder of the constant current from the first current source is subtracted from half of the remainder of the constant current from the second current source to define a first measurement current. Since the constant currents from the first and second current sources are equal, this first measurement current is half of the difference between the reference current and the read current (i.e., the reference current minus the read current). Concurrently, half of the remainder of the constant current from the first current source is subtracted from half of the remainder of the constant current from the second current source to define a second measurement current. Once again, since the constant currents from the first and second current sources are equal, the second measurement current is half of the difference between the read current and the reference current (i.e., the read current minus the reference current).

The first measurement current can then be integrated to produce a first measurement voltage, and the second measurement current can be integrated to produce a second measurement voltage. Because the first and second measurement voltages are based upon the positive and negative differences between the read current and the reference current, the two measurement voltages will be substantially similar if the states of the memory cell and the reference memory cell (as indicated by the read current and the reference current) are the same, while the measurement voltages will diverge if the two states are different. Note that this divergence will increase as the period of integration for the measurement voltages increases. Once the measurement voltages have been generated, a comparator can be used to compare the two and determine the state of the memory cell relative to the reference memory cell. According to an embodiment of the invention, a fast comparator can be used to improve the speed of the sensing operation.

The present invention will be more fully understood in view of the following description and drawings.

DETAILED DESCRIPTION

Figure 1:
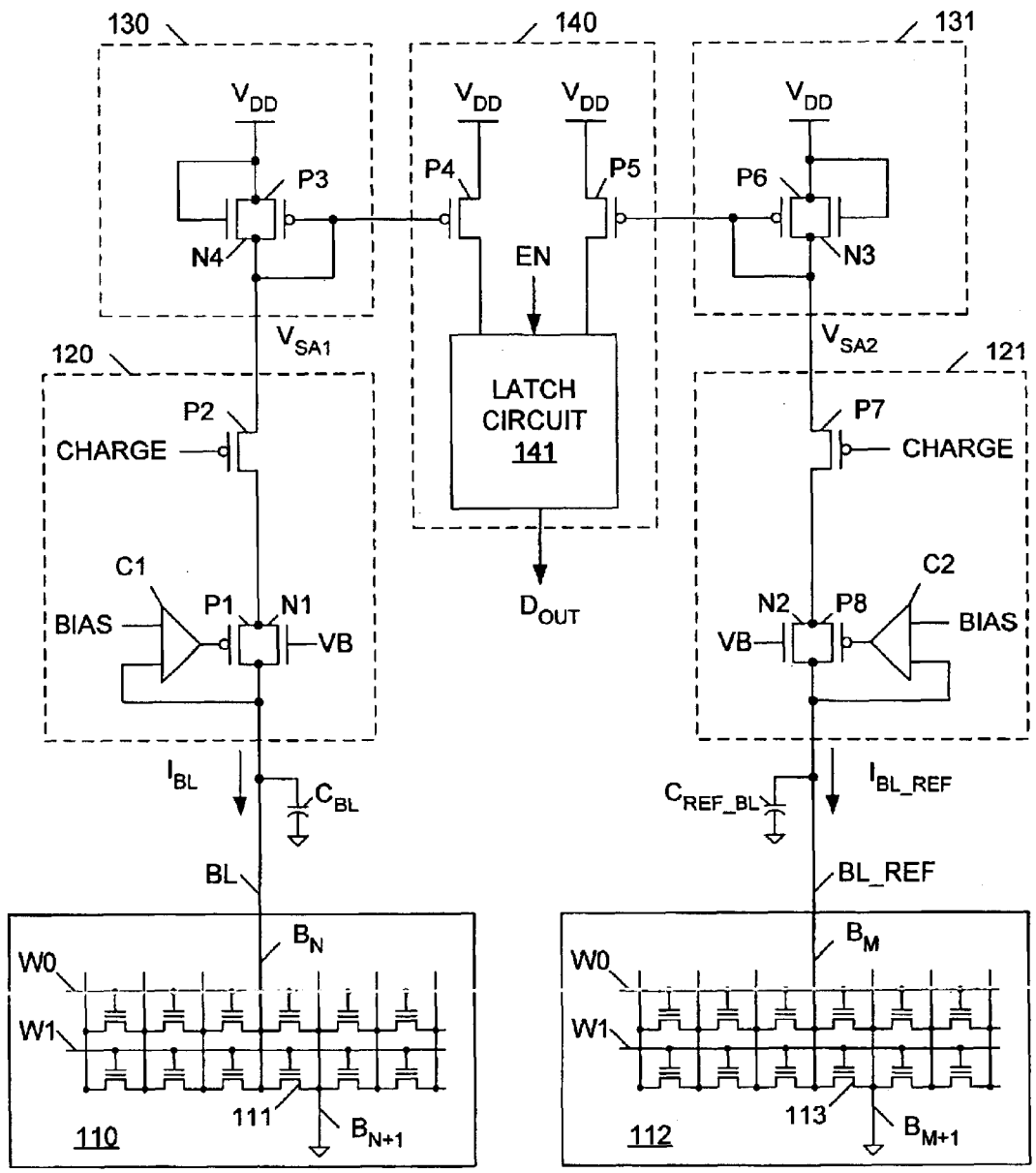
FIG. 1 is a circuit diagram of a conventional memory device.
Figure 2:
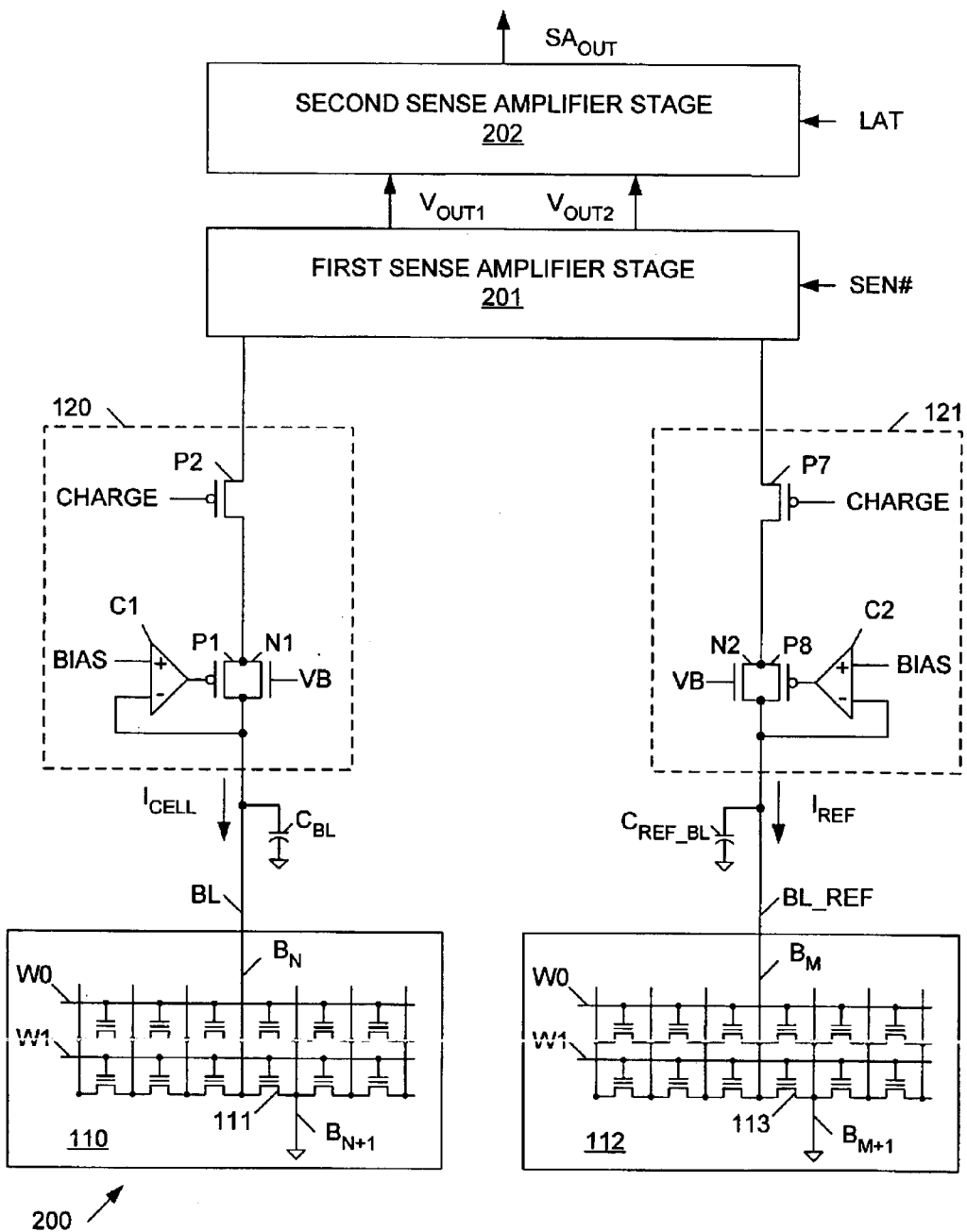
FIG. 2 is a circuit diagram of a memory system in accordance with one embodiment of the present invention.

FIG. 2 is a circuit diagram of a memory system 200 in accordance with one embodiment of the present invention. Because certain elements of memory system 200 are similar to certain elements of memory system 100 (FIG. 1), similar elements in FIGS. 1 and 2 are labeled with similar reference numbers. Thus, memory system 200 includes, memory array 110, non-volatile memory cell 111, reference memory array 112, reference memory cell 113, clamping circuits 120-121, and bit lines BL and BL_REF (which exhibit bit line capacitances $C_{BL}$ and $C_{BL\_REF}$).

Although memory array 110 and reference memory array 112 are illustrated as arrays having two rows and six columns, it is understood that memory array 110 and reference memory array 112 can have other dimensions in other embodiments. It is also understood that row and column decoding circuitry is not illustrated in memory array 110 or reference memory array 112 for purposes of clarity. According to another embodiment of the invention, the reference memory array 112 can be replaced with a single non-volatile memory cell, (e.g., non-volatile memory cell 113), which provides a known reference logic state for use in sensing operations for all the memory cells in memory array 110. In this embodiment, the silicon area required for memory system 200 can be significantly reduced.

Memory system 200 additionally includes sense amplifier first stage 201 and sense amplifier second stage 202. Sense amplifier first stage 201 is coupled to bit lines BL and BL_REF. As described in more detail below, sense amplifier first stage 201 provides the read current $I_{CELL}$ and the reference read current $I_{REF\_CELL}$ to bit lines BL and BL_REF, respectively. Sense amplifier first stage 201 is also coupled to receive an active-low sense initialization signal SEN#.

Sense amplifier first stage 201 provides differential output voltages $V_{OUT1}$ and $V_{OUT2}$ to sense amplifier second stage 202. Second amplifier stage 202 is also coupled to receive an active-high enable signal, LAT. As described in more detail below, sense amplifier second stage 202 provides an output data value $SA_{OUT}$ in response to the output voltages $V_{OUT1}$ and $V_{OUT2}$ when the enable signal LAT is activated high.

Returning to FIG. 2, memory cell 111 is selected for a read operation by applying a word line read voltage (e.g., 3–5 Volts) to word line W1 of array 110, coupling bit line $B_N$ to system bit line BL through a column decoder (not shown), and coupling bit line $B_{N+1}$ to a ground supply voltage. At the same time, reference memory cell 113 is also selected by applying the word line read voltage to word line W1 of array 112, coupling bit line $B_M$ to reference bit line BL_REF through a column decoder (not shown), and coupling bit line $B_{M+1}$ to a ground supply voltage.

Unlike conventional sense amplifiers, sense amplifier first stage 201 does not compare a read voltage or read current (i.e., $I_{CELL}$) introduced by the selected memory cell 111 directly against a reference voltage or current. Instead, sense amplifier first stage 201 performs a current integration operation based on positive and negative differentials between the read current $I_{CELL}$ and the reference current $I_{REF}$. This integration operation (described in more detail below) results in the generation of differential output voltages $V_{OUT1}$ and $V_{OUT2}$. The longer the integration period, the larger the difference between differential output voltages $V_{OUT1}$ and $V_{OUT2}$. After a desired integration period, the enable signal LAT is activated, thereby instructing sense amplifier second stage 202 to sample the differential output voltages $V_{OUT1}$ and $V_{OUT2}$, and in response, generate a sense amplifier output $SA_{OUT}$ (which indicates the state of the memory cell being sensed).

Figure 3:
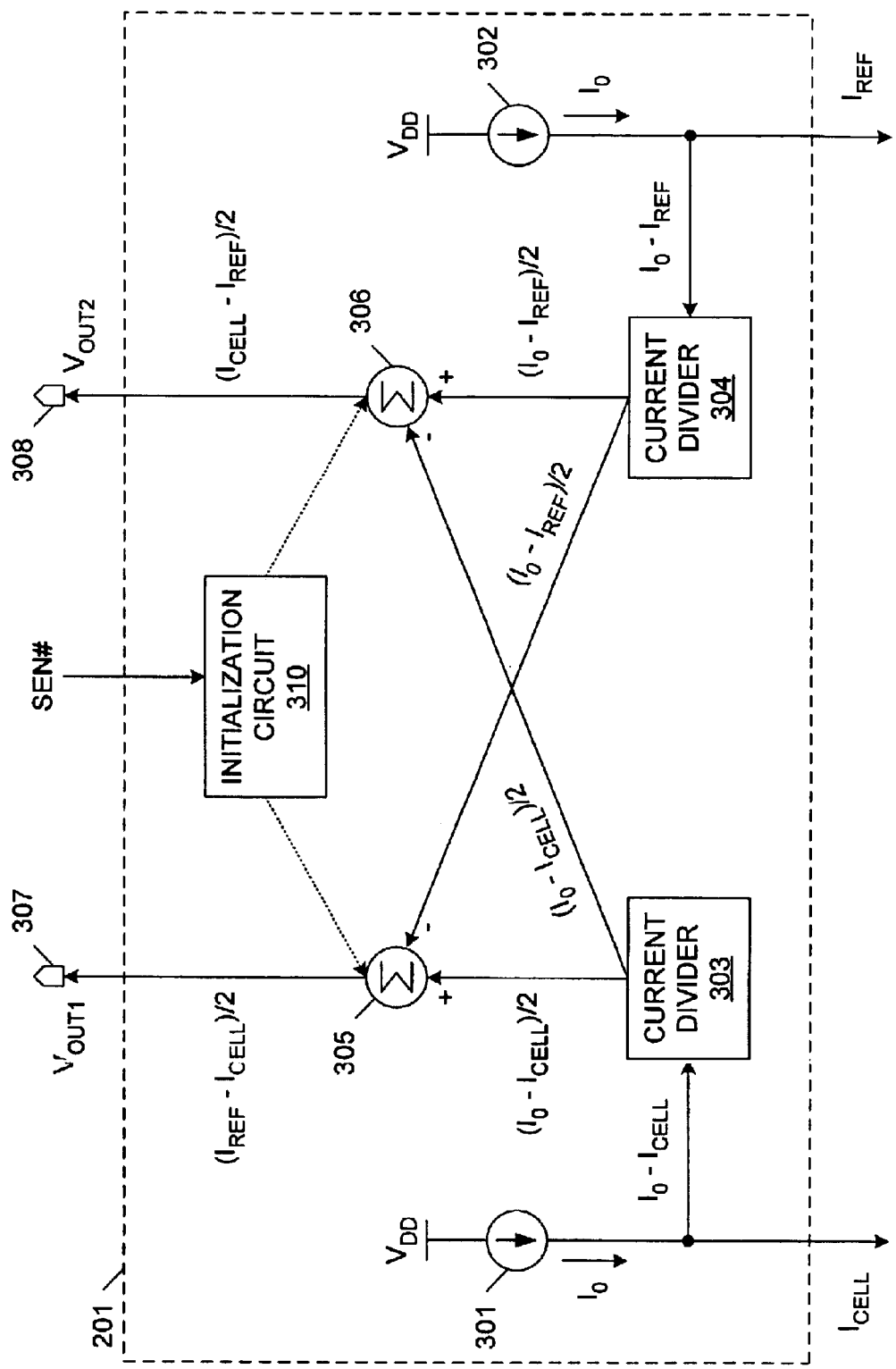
FIG. 3 is a block diagram of a sense amplifier first stage, in accordance with one embodiment of the present invention.

FIG. 3 is a block diagram of sense amplifier first stage 201, in accordance with one embodiment of the present invention. Sense amplifier first stage 201 includes constant current sources 301–302, current divider circuits 303–304, current subtraction circuits 305–306, output nodes 307–308 and initialization circuit 310. Initialization circuit 310 is configured to receive the SEN# signal. At the beginning of a sensing operation, the SEN# signal is activated low, thereby causing initialization circuit to equalize (reset) the charge on current subtraction circuits 305–306 and output nodes 307–308.

During a sensing operation, constant current sources 301 and 302 each provide a constant current $I_0$. This constant current $I_0$ is greater than the expected read current $I_{CELL}$ (and the reference read current $I_{REF}$). A portion of the constant current $I_0$ provided by current source 301 flows to the memory cell being sensed (e.g., memory cell 111) as the read current $I_{CELL}$. The remaining portion of constant current $I_0$ provided by current source 301 (i.e., $I_0-I_{CELL}$) flows to current divider circuit 303.

Similarly, a portion of the constant current $I_0$ provided by current source 302 flows to the reference memory cell (e.g., reference memory cell 113) as the reference read current $I_{REF}$. The remaining portion of constant current $I_0$ provided by current source 301 (i.e., $I_0-I_{REF}$) flows to current divider circuit 303.

Current dividers 303 and 304 each divide the received currents in half. Thus, current divider 303 divides the received current of $I_0-I_{CELL}$ into two equal currents of $(I_0-I_{CELL})/2$. Similarly, current divider 304 divides the received current of $I_0-I_{REF}$ into two equal currents of $(I_0-I_{REF})/2$.

Current subtraction circuit 305 is configured to subtract the current $(I_0-I_{REF})/2$ provided by current divider 304 from the current $(I_0-I_{CELL})/2$ provided by current divider 303, thereby providing an output current equal to $(I_{REF}-I_{CELL})/2$. Similarly, current subtraction circuit 306 is configured to subtract the current $(I_0-I_{CELL})/2$ provided by current divider 303 from the current $(I_0-I_{REF})/2$ provided by current divider 304, thereby providing an output current equal to $(I_{CELL}-I_{REF})/2$.

Output node 307 is configured to receive the output current $(I_{REF}-I_{CELL})/2$ provided by current subtraction circuit 305. Output node 307, which is coupled to the gate of a transistor in sense amplifier second stage 202, exhibits a capacitance $C_{OUT1}$. As a result, the output voltage $V_{OUT1}$ is developed on output node 307. This output voltage $V_{OUT1}$ can be defined as follows, where $V_0$ is equal to the initial voltage on output node 307 before the sensing operation is started.

$$V_{OUT1}(t)=(\int I_{OUT1}(t)dt)/C_{OUT1}=V_0+I_{OUT1}*t/C_{OUT1} \quad (2)$$

Similarly, output node 308 is configured to receive the output current $(I_{CELL}-I_{REF})/2$ provided by current subtraction circuit 306. Output node 308, which is coupled to the gate of a transistor in sense amplifier second stage 202, exhibits a capacitance $C_{OUT2}$. As a result, the output voltage $V_{OUT2}$ is developed on output node 308. This output voltage $V_{OUT2}$ can be defined as follows, where $V_0$ is equal to the initial voltage on output node 308 before the sensing operation is started.

$$V_{OUT2}(t)=(\int I_{OUT2}(t)dt)/C_{OUT2}=V_0+I_{OUT2}*t/C_{OUT2} \quad (3)$$

The difference between the output voltages $V_{OUT1}$ and $V_{OUT2}$ can be defined as follows.

$$V_{OUT1}(t)-V_{OUT2}(t)=(V_0+I_{OUT1}*t/C_{OUT1})-(V_0+I_{OUT2}*t/C_{OUT2}) \quad (4)$$

In the described embodiment, sense amplifier first stage 201 and sense amplifier second stage 202 are designed such that $C_{OUT2}$ is equal to $C_{OUT1}$. Capacitances $C_{OUT1}$ and $C_{OUT2}$ can therefore be represented by the equivalent capacitance value $C_{OUT}$. As a result, equation (4) can be simplified as follows.

$$V_{OUT1}(t)-V_{OUT2}(t)=(I_{REF}-I_{CELL})*t/2C_{OUT}-(I_{CELL}-I_{REF})*t/2C_{OUT} \quad (5)$$

$$V_{OUT1}(t)-V_{OUT2}(t)=((I_{REF}-I_{CELL})*t-(I_{CELL}-I_{REF})*t)/2C_{OUT} \quad (6)$$

$$V_{OUT1}(t)-V_{OUT2}(t)=(2I_{REF}*t-2I_{CELL}*t)/2C_{OUT} \quad (7)$$

$$V_{OUT1}(t)-V_{OUT2}(t)=(I_{REF}-I_{CELL})*t/C_{OUT} \quad (8)$$

The differential output signal represented by output voltages $V_{OUT1}(t)$ and $V_{OUT2}(t)$ is therefore a function of the differential input signal to sense amplifier first stage 201, $I_{REF}-I_{CELL}$. The differential output signal represented by output voltages $V_{OUT1}(t)$ and $V_{OUT2}(t)$ therefore includes required information about the compared input signals. Sense amplifier first stage 201 integrates the differential input current ($I_{REF}-I_{CELL}$), such that the differential output signal represented by output voltages $V_{OUT1}(t)$ and $V_{OUT2}(t)$ increases linearly with time. As a result, sense amplifier first stage 201 exhibits a relatively high sensitivity to differences between the input currents ($I_{REF}$ and $I_{CELL}$), while exhibiting a relatively low sensitivity to noise in the $V_{DD}$ supply voltage.

As described in more detail below, sense amplifier second stage 202 compares the differential output voltages $V_{OUT1}$ and $V_{OUT2}$, and provides a data output signal $SA_{OUT}$ which has a first state if $V_{OUT1}$ is greater than $V_{OUT2}$, and a second logic state if $V_{OUT1}$ is less than $V_{OUT2}$.

Figure 4:
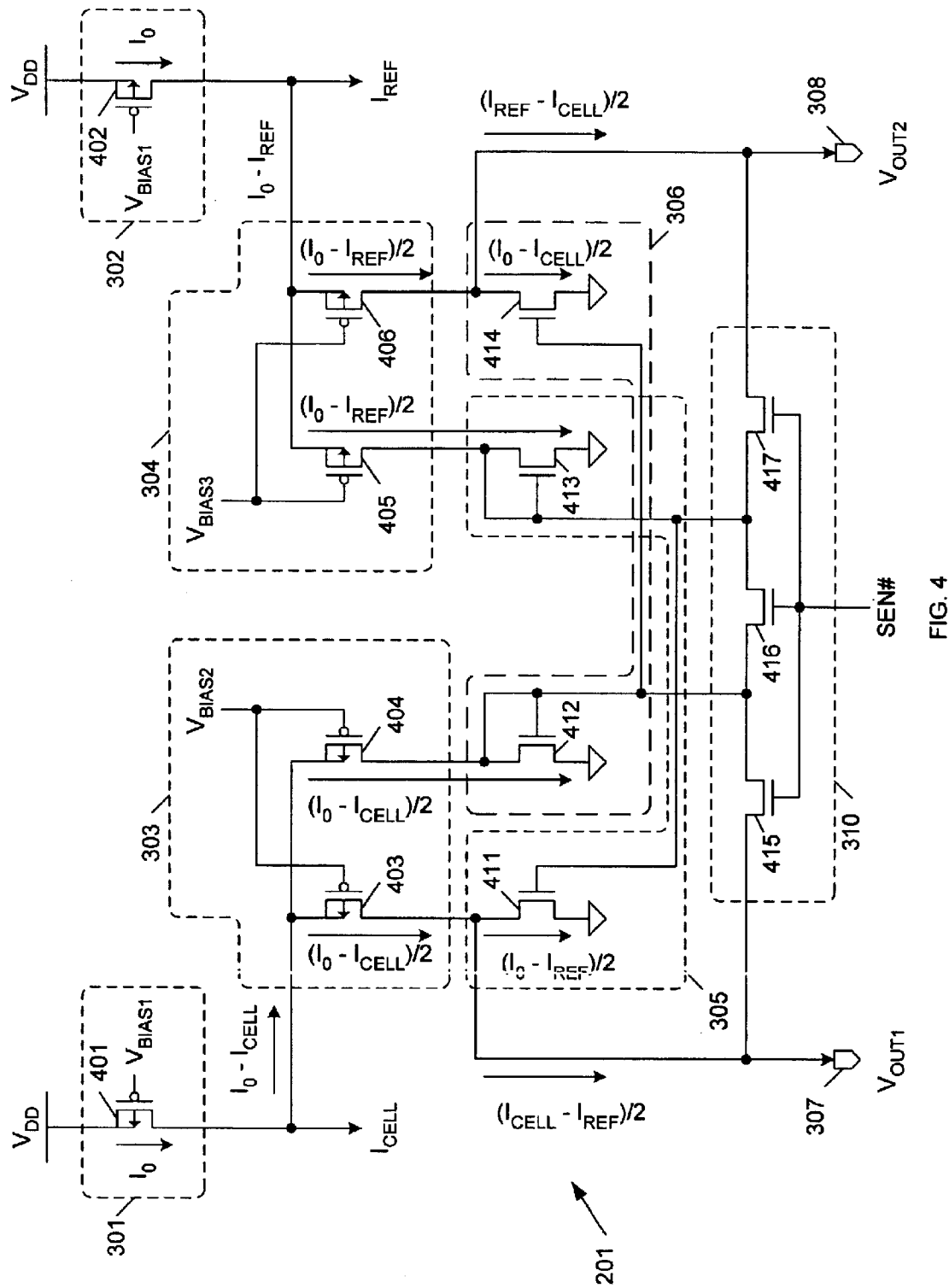
FIG. 4 is a circuit diagram of the sense amplifier first stage of FIG. 3 in accordance with one embodiment of the present invention.

FIG. 4 is a circuit diagram of sense amplifier first stage 201 in accordance with one embodiment of the present invention. Sense amplifier first stage 201 includes PMOS transistors 401–406 and NMOS transistors 411–417. PMOS transistors 401 and 402 form constant current sources 301 and 302, respectively. The source and bulk regions of PMOS transistors 401 and 402 are coupled to the $V_{DD}$ voltage supply terminal. The gates of PMOS transistors 401 and 402 are coupled to receive a first bias voltage $V_{BIAS1}$. The first bias voltage $V_{BIAS1}$ is selected such that the constant current $I_0$ flows through each of PMOS transistors 401 and 402. The drain of PMOS transistor 401 is coupled to the memory cell being read and current divider circuit 303. As described above, current divider circuit 303 receives a current equal to ($I_0-I_{CELL}$). The drain of PMOS transistor 402 is coupled to the reference memory cell and current divider circuit 304. As described above, current divider circuit 304 receives a current equal to ($I_0-I_{REF}$).

PMOS transistors 403–404 are identical transistors configured to form current divider circuit 303. The source and bulk regions of PMOS transistors 403 and 404 are coupled to receive the current, ($I_0-I_{CELL}$). The gates of PMOS transistors 403 and 404 are coupled to receive a second bias voltage $V_{BIAS2}$. As a result, half of the current ($I_0-I_{CELL}$) flows through each of PMOS transistors 403 and 404 (i.e., ($I_0-I_{CELL}$)/2 flows through each of PMOS transistors 403 and 404). The drains of PMOS transistors 403 and 404 are coupled to the drains of NMOS transistors 411 and 412, respectively.

Similarly, PMOS transistors 405–406 are identical transistors configured to form current divider circuit 304. The source and bulk regions of PMOS transistors 405 and 406 are coupled to receive the current, ($I_0-I_{REF}$). The gates of PMOS transistors 405 and 406 are coupled to receive a third bias voltage $V_{BIAS3}$. As a result, half of the current ($I_0-I_{REF}$) flows through each of PMOS transistors 405 and 406 (i.e., ($I_0-I_{REF}$)/2 flows through each of PMOS transistors 405 and 406). The drains of PMOS transistors 405 and 406 are coupled to the drains of NMOS transistors 413 and 414, respectively.

NMOS transistors 411 and 413 are configured to form current subtraction circuit 305. The sources of NMOS transistors 411 and 413 are coupled to the ground supply terminal. The gates of NMOS transistors 411 and 413 are commonly connected to the drain of NMOS transistor 413, thereby forming a current mirror circuit, whereby the current through NMOS transistor 413 is mirrored to NMOS transistor 411. Thus, the current of ($I_0-I_{REF}$)/2 flowing through NMOS transistor 413 is mirrored to NMOS transistor 411. As a result, the current flowing to output terminal 307 is necessarily equal to (($I_0-I_{CELL}$)/2–($I_0-I_{REF}$)/2), or ($I_{CELL}-I_{REF}$)/2. This current charges output terminal 307 to the output voltage $V_{OUT1}$ as described above.

Similarly, NMOS transistors 412 and 414 are configured to form current subtraction circuit 306. The sources of NMOS transistors 412 and 414 are coupled to the ground supply terminal. The gates of NMOS transistors 412 and 414 are commonly connected to the drain of NMOS transistor 412, thereby forming a current mirror circuit, whereby the current through NMOS transistor 412 is mirrored to NMOS transistor 414. Thus, the current of ($I_0-I_{CELL}$)/2 flowing through NMOS transistor 412 is mirrored to NMOS transistor 414. As a result, the current flowing to output terminal 308 is necessarily equal to (($I_0-I_{REF}$)/2–($I_0-I_{CELL}$)/2), or ($I_{REF}-I_{CELL}$)/2. This current charges output terminal 308 to the output voltage $V_{OUT2}$ as described above.

NMOS transistors 415–417 are configured to form initialization circuit 310. NMOS transistors 415–417 are connected in series between output terminals 307 and 308. The source of transistor 416 is coupled to the gates of NMOS transistors 412 and 414. The drain of NMOS transistor 416 is coupled to the gates of NMOS transistors 411 and 413. The gates of NMOS transistors 412 are coupled to receive the SEN# signal. When the SEN# signal is de-activated high ($V_{DD}$), NMOS transistors 415–417 are turned on, thereby equalizing the voltages on output terminals 307–308, the gates of transistors 411–414 and the drains of transistors 412–413. When sensing begins, the SEN# signal is activated low (0 Volts), such that NMOS transistors 415–417 are turned off, and the differential output voltages $V_{OUT1}$ and $V_{OUT2}$ develop on output terminals 307 and 308 in the manner described above.

In accordance with one embodiment of the present invention, the second and third bias voltages $V_{BIAS2}$ and $V_{BIAS3}$ are the same voltage, which is provided by an external bias voltage supply.

Figure 5A:
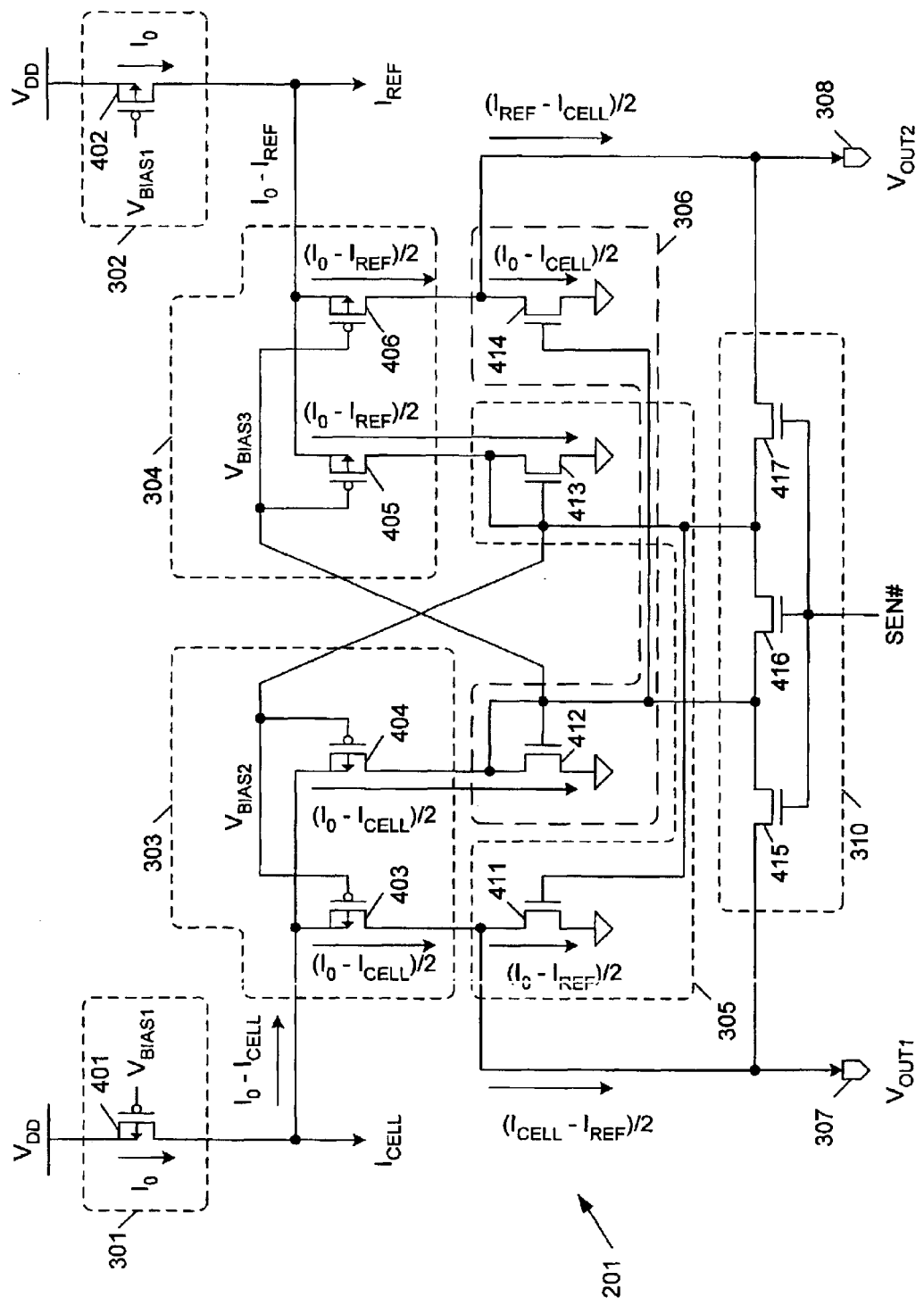
FIG. 5A is a circuit diagram of the sense amplifier first stage of FIG. 3 in accordance with another embodiment of the present invention.

In accordance with another embodiment of the present invention, the second bias voltage $V_{BIAS2}$ is provided by the drain of PMOS transistor 405, and the third bias voltage $V_{BIAS3}$ is provided by the drain of PMOS transistor 404. FIG. 5A is a circuit diagram illustrating this embodiment of the present invention.

Figure 5B:
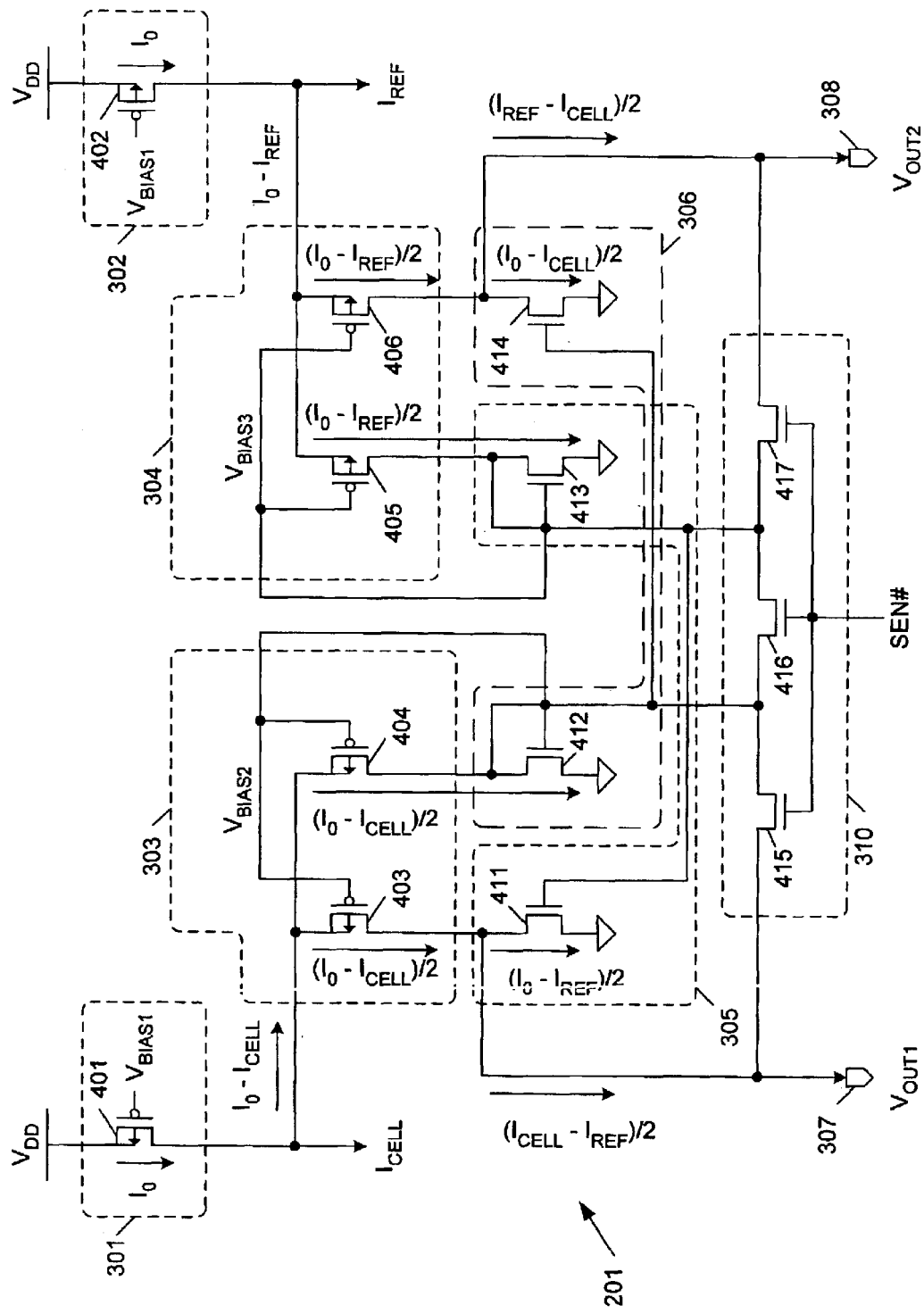
FIG. 5B is a circuit diagram of the sense amplifier first stage of FIG. 3 in accordance with yet another embodiment of the present invention.

In accordance with another embodiment of the present invention, the second bias voltage $V_{BIAS2}$ is provided by the drain of PMOS transistor 404, and the third bias voltage $V_{BIAS3}$ is provided by the drain of PMOS transistor 405. FIG. 5B is a circuit diagram illustrating this embodiment of the present invention. Advantageously, the embodiments illustrated by FIGS. 5A and 5B do not require an additional voltage supply.

Figure 6:
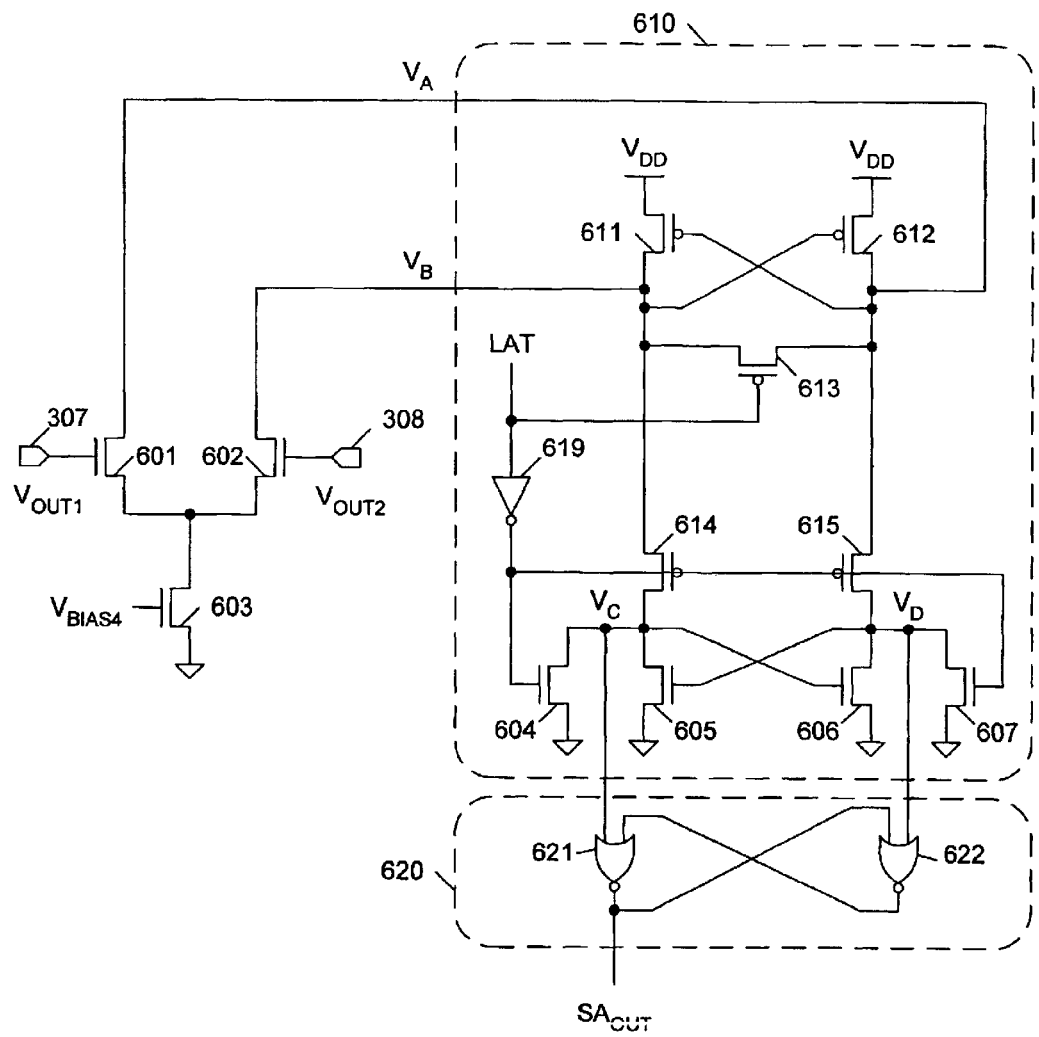
FIG. 6 is a circuit diagram of a sense amplifier second stage in accordance with one embodiment of the present invention.

FIG. 6 is a circuit diagram of sense amplifier second stage 202 in accordance with one embodiment of the present invention. Sense amplifier second stage 202 includes NMOS transistors 601–607, PMOS transistors 611–615, inverter 619 and NOR gates 621–622.

NMOS transistors 601 and 602 form a differential input pair, with the gate of NMOS transistor 601 coupled to receive the output voltage $V_{OUT1}$ from output terminal 307 of sense amplifier first stage 201, and the gate of NMOS transistor 602 coupled to receive the output voltage $V_{OUT2}$ from the output terminal 308 of sense amplifier first stage 201. The gate terminals of NMOS transistors 601 and 602 contribute to the capacitances $C_{OUT1}$ and $C_{OUT2}$ of output terminals 307 and 308, respectively. NMOS transistor 603 is coupled between the sources of NMOS transistors 601–602 and the ground supply terminal. A fourth bias voltage $V_{BIAS4}$ is applied to the gate of NMOS transistor 603, thereby providing a current source to the differential pair formed by NMOS transistors 601–602. The voltages on the drains of NMOS transistors 601 and 602 are labeled as voltages $V_A$ and $V_B$, respectively.

PMOS transistors 611–615, NMOS transistors 604–607 and inverter 619 are configured to form a CMOS latch circuit 610. More specifically, the drains of transistors 601 and 602 are connected to the drains of p-type transistors 612 and 611, respectively. PMOS transistor 611, PMOS transistor 614 and NMOS transistor 605 are connected in series between the VDD voltage supply terminal and the ground supply terminal. PMOS transistor 612, PMOS transistor 615 and NMOS transistor 606 are also connected in series between the VDD voltage supply terminal and the ground supply terminal. PMOS transistors 611 and 612 are cross-coupled, such that the gate of transistor 611 is coupled to the drain of transistor 611, and the gate of transistor 612 is coupled to the drain of transistor 611. NMOS transistors 605 and 606 are also cross-coupled, such that the gate of transistor 605 is coupled to the drain of transistor 606, and the gate of transistor 606 is coupled to the drain of transistor 605.

PMOS transistor 613 is connected across the drains of PMOS transistors 611 and 612, with the gate of PMOS transistor 613 being coupled to receive the enable signal LAT. The enable signal LAT is inverted by inverter 619 and then applied to the gates of PMOS transistors 614–615 and NMOS transistors 604 and 607. NMOS transistor 604 is connected between the drain of NMOS transistor 605 and the ground supply terminal. Similarly, NMOS transistor 607 is coupled between the drain of NMOS transistor 606 and the ground supply terminal.

NOR gates 621 and 622 are configured to form a data latch 620. More specifically, one input terminal of NOR gate 621 is coupled to the drain of NMOS transistor 605, and the other input terminal of NOR gate 621 is coupled to the output terminal of NOR gate 622. Similarly, one input terminal of NOR gate 622 is coupled to the drain of NMOS transistor 606, and the other input terminal of NOR gate 622 is coupled to the output terminal of NOR gate 621. The output terminal of NOR gate 621 provides the output signal $SA_{OUT}$.

The CMOS latch circuit 610 is turned off (i.e., the LAT signal is de-activated low) when there is no sensing operation being performed. At this time, transistors 604, 607 and 613 are turned on, and transistors 614–615 are turned off. Under these conditions, turned-on transistor 613 equalizes the voltages $V_A$ and $V_B$ on the drains of differential pair transistors 601 and 602. In addition, turned-on transistors provide logic low voltages to the input terminals of NOR gates 621–622. As a result, data latch 620 continues to provide the previously stored output value $SA_{OUT}$. The voltages provided to the input terminals of NOR gates 621 and 622 are labeled as voltages $V_C$ and $V_D$, respectively.

During a sensing operation, the LAT signal is activated high, thereby turning off transistors 604, 607 and 613, and turning on transistors 614–615. Under these conditions, CMOS latch circuit 610 is enabled, and operates as follows. As described above, one of the output voltages $V_{OUT1}$, $V_{OUT2}$ will be higher than the other. For example, the output voltage $V_{OUT2}$ may be higher than the output voltage $V_{OUT1}$. In this case, transistor 602 will have a higher conductance than transistor 601, such that voltage $V_B$ is less than voltage $V_A$. In response, transistors 612 and 605 will turn on, and transistors 611 and 606 will turn off, thereby pulling down the voltage $V_C$ to a logic low value, and pulling up the voltage $V_D$ to a logic high value. As a result, NOR gate 622 provides a logic low value to NOR gate 621, and NOR gate 621 provides a logic high output value $SA_{OUT}$.

Conversely, if the output voltage $V_{OUT1}$ is higher than the output voltage $V_{OUT2}$, transistor 601 will have a higher conductance than transistor 602, such that voltage $V_A$ is less than voltage $V_B$. In response, transistors 611 and 606 will turn on, and transistors 612 and 605 will turn off, thereby pulling down the voltage $V_D$ to a logic low value, and pulling up the voltage $V_C$ to a logic high value. As a result, NOR gate 621 provides a logic high output value $SA_{OUT}$, and NOR gate 622 provides a logic low output value.

Figure 7:
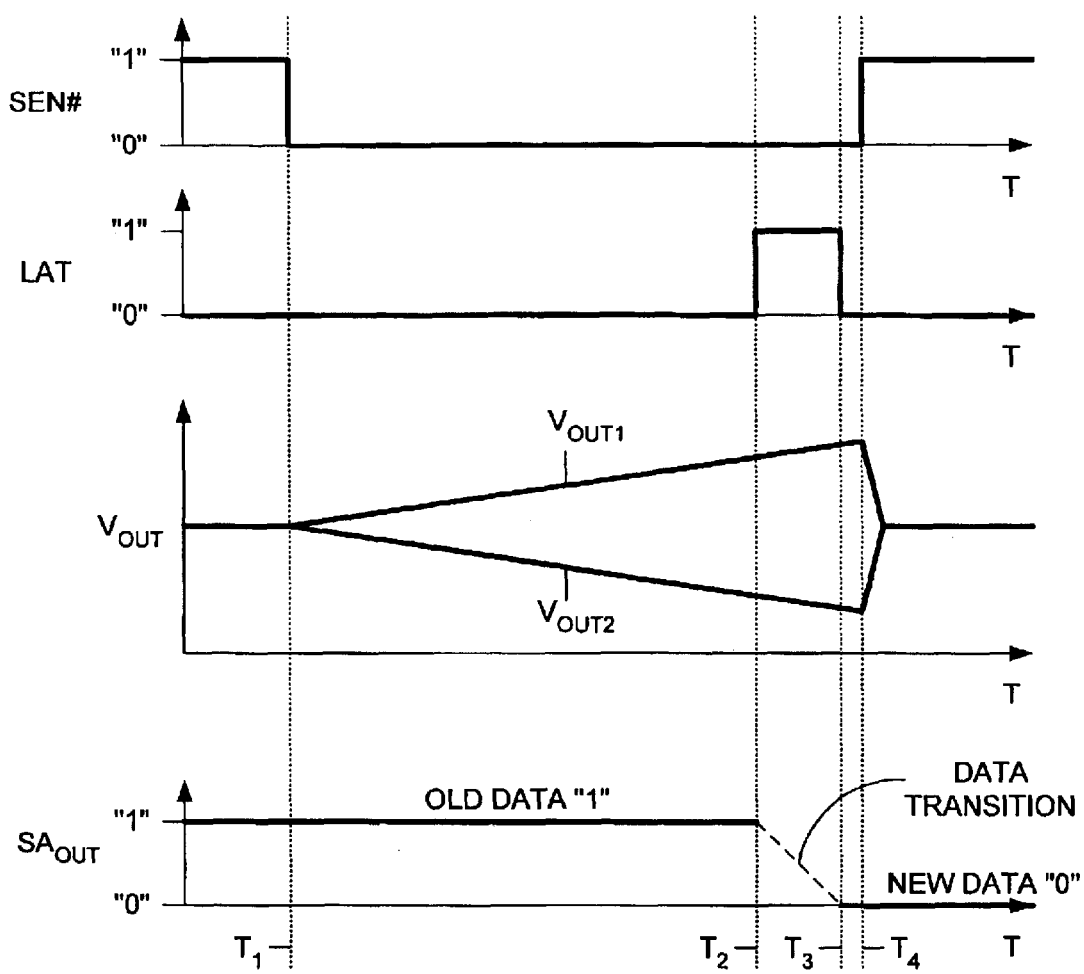
FIG. 7 is a waveform diagram illustrating various signals associated with the operation of the sense amplifier first and second stages during a read operation.

FIG. 7 is a waveform diagram illustrating the SEN#, LAT, $V_{OUT1}/V_{OUT2}$ and $SA_{OUT}$ signals during a sensing operation. Prior to time T1, the SEN# signal is de-activated high, such that equalization circuit 310 is enabled. Under these conditions, the differential output voltage signals $V_{OUT1}$ and $V_{OUT2}$ have the same voltage. Data output latch 620 stores the previously read data value $SA_{OUT}$, which happens to be a logic "1" value in the present example.

At time T1, the SEN# signal is activated low, thereby disabling equalization circuit 310 in sense amplifier first stage 201. At this time, the output currents $(I_{CELL}-I_{REF})/2$ and $(I_{REF}-I_{CELL})/2$ begin to charge output terminals 307 and 308 to output voltages $V_{OUT1}$ and $V_{OUT2}$, respectively. These output terminals 307 and 308 charge linearly with respect to time.

At time T2, the enable signal LAT is activated high, thereby enabling sense amplifier second stage 202. In the described example, the output voltage $V_{OUT1}$ is greater than the output voltage $V_{OUT2}$. As a result, the output signal $SA_{OUT}$ transitions from a logic "1" value to a logic "0" value between time T2 and time T3.

At time T3, the enable signal LAT is de-activated low, thereby disabling sense amplifier second stage 202. At this time, the logic "0" output signal SAOUT is stored in data latch 620.

At time T4, the SEN# signal is de-activated high, thereby enabling equalization circuit 310, and causing the output voltage $V_{OUT1}$ and $V_{OUT2}$ on output terminals 307 and 308 to be equalized. At this time sense amplifier stages 201–202 are ready to begin the next sensing operation.

The various embodiments of the structures and methods of this invention that are described above are illustrative only of the principles of this invention and are not intended to limit the scope of the invention to the particular embodiments described. For example, although the present invention has been described with reference to a memory array including NVM cells, the present invention is equally applicable to other types of memory cell arrays. Also, while various specific implementations of the invention have been illustrated using p-type or n-type devices, implementations using alternative device types will be readily apparent. Thus, the invention is limited only by the following claims and their equivalents.

I claim:

1. A sensing system for sensing a state of a memory cell, the sensing system comprising:

a first input terminal for providing a read current based on the state of the memory cell to the memory cell;

a second input terminal for providing a reference current based on a known state of a reference memory cell to the reference memory cell; and a current integrator circuit comprising:

a first current collector circuit for integrating a first measurement current to generate a first measurement voltage at a first output terminal, the first measurement current being; function of the read current subtracted from the reference current; and a second collector circuit for integrating a second measurement current to generate a second measurement voltage at a second output terminal, the second measurement current being a function of the reference current subtracted from the read current.

2. The sensing system of claim 1, further comprising:
a first current source for generating a first constant current, a first portion of the first constant current flowing through the first input terminal as the read current; and
a second current source for generating a second constant current, a first portion of the second constant current flowing through the second input terminal as the reference current, wherein the first constant current is equal to the second constant current.

3. The sensing system of claim 2, wherein the first current source comprises a first p-type transistor connected between a supply voltage and the first input terminal, the first p-type transistor having a gate coupled to receive a first bias voltage, the first bias voltage causing the first p-type transistor to source the first constant current, and
wherein the second current source comprises a second p-type transistor connected between the supply voltage and the second input terminal, the second p-type transistor having a gate coupled to receive the first bias voltage, the first bias voltage causing the second p-type transistor to source the second constant current, wherein the first p-type transistor and the second p-type transistor are identical.

4. The sensing system of claim 2, further comprising:
a first current divider coupled to receive a first intermediate current from the first current source, the first intermediate current being equal to the first constant current minus the read current, the first current divider being configured to divide the first intermediate current into two equal first current portions;
a second current divider coupled to receive a second intermediate current from the second current source, the second intermediate current being equal to the second constant current minus the reference current, the second current divider being configured to divide the second intermediate current into two equal second current portions;
a first current differentiator coupled to receive a first one of the first current portions from the first current divider and a first one of the second current portions from the second current divider and generate the first measurement current by subtracting the second current portion from the first current portion; and
a second current differentiator coupled to receive a second one of the first current portions from the first current divider and a second one of the second current portions from the second current divider and generate the second measurement current by subtracting the first current portion from the second current portion.

5. The sensing system of claim 4, wherein the first current divider comprises a first p-type transistor and a second p-type transistor, the first p-type transistor having a first source coupled to receive the first intermediate current, a first drain, and a first gate coupled to receive a first bias voltage, and the second p-type transistor having a second source connected to the first source, second drain, and a second gate connected to the first gate, the first drain providing the first one of the first current portions to the first current differentiator and the second drain providing the second one of the first current portions to the second current differentiator, and
wherein the second current divider comprises a third p-type transistor and a fourth p-type transistor, the third p-type transistor having a third source coupled to receive the second intermediate current, a third drain, and a third gate coupled to receive a second bias voltage, and the fourth p-type transistor having a fourth source connected to the third source, a fourth drain, and a fourth gate connected to the third gate, the fourth drain providing the first one of the second current portions to the first current differentiator and the third drain providing the second one of the second current portions to the second current differentiator.

6. The sensing system of claim 5, wherein the first current differentiator comprises a first n-type transistor and a second n-type transistor, the first n-type transistor having a fifth drain connected to the first drain, a fifth source connected to ground, and a fifth gate, and the second n-type transistor having a sixth drain connected to the fourth drain, a sixth source connected to ground, and a sixth gate connected to the fourth drain and the fifth gate, and
wherein the second current differentiator comprises a third n-type transistor and a fourth n-type transistor, the third n-type transistor having a seventh drain connected to the third drain, a seventh source connected to ground, and a seventh gate, and the fourth n-type transistor having a eighth drain connected to the second drain, an eighth source connected to ground, and an eighth gate connected to the second drain and the seventh gate.

7. The sensing system of claim 6, wherein the first gate is connected to the sixth gate and the third gate is connected to the eighth gate.

8. The sensing system of claim 6, wherein the first gate is connected to the eighth gate and the third gate is connected to the sixth gate.

9. The sensing system of claim 6, wherein the first collector circuit comprises a first capacitor connected between the fifth drain and the first output terminal, and wherein the second collector circuit comprises a second capacitor connected between the seventh drain and the second output terminal.

10. The sensing system of claim 9, further comprising an initialization circuit for performing an initialization operation to equalize charge on the first capacitor and the second capacitor.

11. The sensing system of claim 10, wherein the initialization circuit comprises:
a fifth n-type transistor connected between the fifth drain and the eighth gate;
a sixth n-type transistor connected between the eighth drain and the sixth drain; and
a seventh n-type transistor connected between the sixth drain and the seventh drain, wherein the fifth n-type transistor, the sixth n-type transistor, and the seventh n-type transistor have commonly-connected gates coupled to receive an initialization signal, the initialization signal being set to a logic 0 state to perform the initialization operation.

12. The sensing system of claim 1, further comprising a comparator for comparing the first measurement voltage and the second measurement voltage to generate an output signal indicating the state of the memory cell relative to the known state of the reference memory cell.

13. The sensing system of claim 12, wherein the comparator comprises a fast comparator.

14. The sensing system of claim 13, wherein the fast comparator comprises:
a first n-type transistor having a first drain, a first source, and a first gate, the first gate being coupled to receive the first measurement voltage;

a second n-type transistor having a second drain, a second source, and a second gate, the second gate being coupled to receive the second measurement voltage;

a third n-type transistor having a third drain connected to the first source and the second source, a third source connected to ground, and a third gate coupled to receive a bias voltage, the bias voltage causing the third n-type transistor to sink currents from the first n-type transistor and a second n-type transistor;

a first flip flop having a first input terminal connected to the second drain and a second input terminal connected to the first drain;

a first p-type transistor connected between the first input terminal and the second input terminal, the first p-type transistor having a fourth gate connected to a control terminal;

a second flip flop having a third input terminal and a fourth input terminal;

a second p-type transistor connected between the first input terminal and the third input terminal;

a third p-type transistor connected between the second input terminal and the fourth input terminal;

a fourth n-type transistor connected between the third input terminal and ground;

a fifth n-type transistor connected between the fourth input terminal and ground;

an inverter connected between the control terminal and the gates of the second p-type transistor, the third p-type transistor, the fourth n-type transistor and the fifth n-type transistor; and a third flip flop having a fifth input terminal connected to the third input terminal and a sixth input terminal connected to the fourth input terminal, and a first output terminal.

15. The sensing system of claim 14, wherein the first flip flop comprises a fourth p-type transistor and a fifth p-type transistor, the fourth p-type transistor being connected between the supply voltage and the first input terminal and being gate-coupled to the second input terminal, and the fifth p-type transistor being connected between the supply voltage and the second input terminal and being gate-coupled to the first input terminal, and wherein the second flip-flop comprises a sixth n-type transistor and a seventh n-type transistor, the sixth n-type transistor being connected between the third input terminal and ground and being gate-coupled to the fourth input terminal, and the seventh n-type transistor being connected between the fourth input terminal and ground and being gate-coupled to the third input terminal, and wherein the third flip flop comprises:

a first NOR gate having a fifth input terminal, a sixth input terminal, and a second output terminal, the fifth input terminal being connected to the third input terminal and the second output terminal being connected to the first output terminal; and a second NOR gate having a seventh input terminal, and eighth input terminal, and a third output terminal, the seventh input terminal being connected to the fourth input terminal, the eighth input terminal being connected to the second output terminal, and the third output terminal being connected to the sixth input terminal.

16. A method for sensing a state of a memory cell, the method comprising:

generating a first measurement current, the first measurement current being a function of a reference current introduced by a reference memory cell minus a read current introduced by the memory cell;

generating a second measurement current, the second measurement current being a function of the read current minus the reference current;

integrating the first measurement current to generate a first measurement voltage;

integrating the second measurement current to generate a second measurement voltage; and comparing the first output voltage and the second measurement voltage to determine the state of the memory cell relative to a known state of the reference memory cell.

17. The method of claim 16, wherein generating the first measurement current comprises:

generating a first source current;

generating a second source current, wherein the second source current is equal to the first source current;

supplying first portion of the first source current to the memory cell as the read current;

supplying a first portion of the second source current to the reference memory cell as the reference current;

dividing a second portion of the first source current into two equal first current portions, wherein the second portion of the first source current comprises the first source current minus the read current;

dividing a second portion of the second source current into two equal second current portions, wherein the second portion of the second source current comprises the first source current minus the reference current; and subtracting the second current portion from the first current portion to produce the first measurement current.

18. The method of claim 17, wherein generating the second measurement current comprises subtracting the first current portion from the second current portion to produce the second measurement current.

19. The method of claim 18, wherein generating the first source current comprises connecting a source of a first p-type transistor to a supply voltage and applying a first bias voltage to a gate of the first p-type transistor, and wherein generating the second source current comprises connecting a source of a second p-type transistor to the supply voltage and applying the first bias voltage to a gate of the second p-type transistor, wherein the first p-type transistor and the second p-type transistor are identical.

20. The method of claim 17, wherein dividing the second portion of the first source current into two equal first current portions comprises supplying the second portion of the first source current to a source of a first p-type transistor and a source of a second p-type transistor, and applying a first bias voltage to a gate of the first p-type transistor and a gate of the second p-type transistor, wherein the first p-type transistor and the second p-type transistor are identical, and wherein dividing the second portion of the second source current into two equal first current portions comprises supplying the second portion of the second source current to a source or a third p-type transistor and a source of a fourth p-type transistor, and applying a second bias voltage to a gate of the third p-type transistor and a gate of the fourth p-type transistor, wherein the third p-type transistor and the fourth p-type transistor are identical.

21. The method of claim 20, wherein subtracting the second current portion from the first current portion comprises:
  connecting a first n-type transistor between a drain of the third p-type transistor and ground and commonly connecting a gate and a drain of the first n-type transistor; and
  connecting a second n-type transistor between a drain of the first p-type transistor and ground and connecting a gate of the second n-type transistor to the gate of the first n-type transistor.

22. The method of claim 21, wherein subtracting the first current portion from the second current portion comprises:
  connecting a third n-type transistor between a drain of the second p-type transistor and ground and commonly connecting a gate and a drain of the third n-type transistor; and
  connecting a fourth n-type transistor between a drain of the fourth p-type transistor and ground and connecting a gate of the fourth n-type transistor to the gate of the third n-type transistor.

23. The method of claim 16, wherein integrating the first measurement current comprises collecting charge from the first measurement current on a first capacitor, and wherein integrating the second measurement current comprises collecting charge from the second measurement current on a second capacitor.

24. The method of claim 23, further comprising equalizing the charge on the first capacitor and the second capacitor before integrating the first measurement current and integrating the second measurement current.

* * * * *